United States Patent
Hatakeyama et al.

(10) Patent No.: US 11,011,345 B2
(45) Date of Patent: May 18, 2021

(54) CHARGED PARTICLE BEAM DEVICE

(71) Applicant: Hitachi High-Tech Corporation, Tokyo (JP)

(72) Inventors: Takumi Hatakeyama, Tokyo (JP); Naoya Ishigaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/786,482

(22) Filed: Feb. 10, 2020

(65) Prior Publication Data
US 2020/0294758 A1 Sep. 17, 2020

(30) Foreign Application Priority Data

Mar. 11, 2019 (JP) .............. JP2019-043299

(51) Int. Cl.
*H01J 37/18* (2006.01)
*H01J 37/28* (2006.01)
*H01J 37/08* (2006.01)
*H01J 37/244* (2006.01)

(52) U.S. Cl.
CPC .............. *H01J 37/18* (2013.01); *H01J 37/08* (2013.01); *H01J 37/244* (2013.01); *H01J 37/28* (2013.01); *H01J 2237/0225* (2013.01)

(58) Field of Classification Search
CPC .......... H01J 37/18; H01J 37/08; H01J 37/244; H01J 37/28; H01J 2237/0225

USPC ..... 250/396 R, 397, 306, 307, 309, 310, 311
See application file for complete search history.

(56) References Cited

U.S. PATENT DOCUMENTS

| | | | | |
|---|---|---|---|---|
| 5,665,966 A | * | 9/1997 | Dahl | H01J 49/025 250/281 |
| 2007/0180924 A1 | * | 8/2007 | Warren | G01N 3/42 73/780 |
| 2014/0346046 A1 | * | 11/2014 | Andelman | H01G 11/30 204/554 |

FOREIGN PATENT DOCUMENTS

JP            5033374 B2    9/2012

* cited by examiner

*Primary Examiner* — Nicole M Ippolito
(74) *Attorney, Agent, or Firm* — Crowell & Moring LLP

(57) ABSTRACT

The present disclosure relates to a charged particle beam device intended to appropriately measure the amount of foreign substances in a vacuum chamber. As one aspect for achieving the above object, proposed is a charged particle beam device including a charged particle beam column (9) configured to irradiate a sample with a charged particle beam, vacuum chambers (1, 2) configured to create a vacuum around the sample, a plurality of electrodes (12) arranged in the vacuum chambers, and a capacitance measuring device (13) for measuring the capacitance between the plurality of electrodes.

11 Claims, 5 Drawing Sheets

CHARGED PARTICLE BEAM DEVICE

TECHNICAL FIELD

The present disclosure relates to a charged particle beam device, and particularly to a charged particle beam device capable of monitoring a state in a vacuum chamber.

BACKGROUND ART

A scanning electron microscope which is one aspect of a charged particle beam device is a device that generates an image by irradiating a sample with an electron beam and detecting signal electrons released from the sample. The vacuum sample chamber is required to be in a vacuum state in order to irradiate the sample with an electron beam, and to be in a clean state in order to prevent discharge and sample contamination due to foreign substances. Patent No. 5033374 (PTL 1) describes that a magnet that adsorbs foreign substances is installed in a vacuum chamber so that metal foreign substances and organic gas molecules generated from the transport unit do not adhere to a wafer that is an observation target of a scanning electron microscope.

CITATION LIST

Patent Literature

PTL 1: JP Patent No. 5033374

SUMMARY OF INVENTION

Technical Problem

According to the technique disclosed in PTL 1, metal foreign substances and organic substances in the vacuum sample chamber can be trapped. However, the foreign substances gradually accumulated over time, the amount of foreign substances changed by the type of sample to be introduced, and the like cannot be detected.

In the following, a charged particle beam device for the purpose of appropriately measuring the amount of foreign substances in the vacuum chamber is proposed.

Solution to Problem

As one aspect for achieving the above object, proposed is a charged particle beam device including a charged particle beam column configured to irradiate a sample with a charged particle beam, a vacuum chamber configured to create a vacuum around the sample, a plurality of electrodes arranged in the vacuum chamber, and a capacitance measuring device for measuring the capacitance between the plurality of electrodes.

Furthermore, as another aspect for achieving the above object, proposed is a charged particle beam device including a charged particle beam column configured to irradiate a sample with a charged particle beam, a vacuum chamber configured to create a vacuum around the sample, a plurality of electrodes arranged in the vacuum chamber, a capacitance measuring device for measuring the capacitance between the plurality of electrodes, and a control device communicatively coupled to the capacitance measuring device to derive a parameter related to the amount of foreign substances based on the output of the capacitance measuring device.

Advantageous Effects of Invention

According to the configuration, the amount of foreign substances in a vacuum chamber can be measured appropriately.

DESCRIPTION OF EMBODIMENTS

Figure 1:
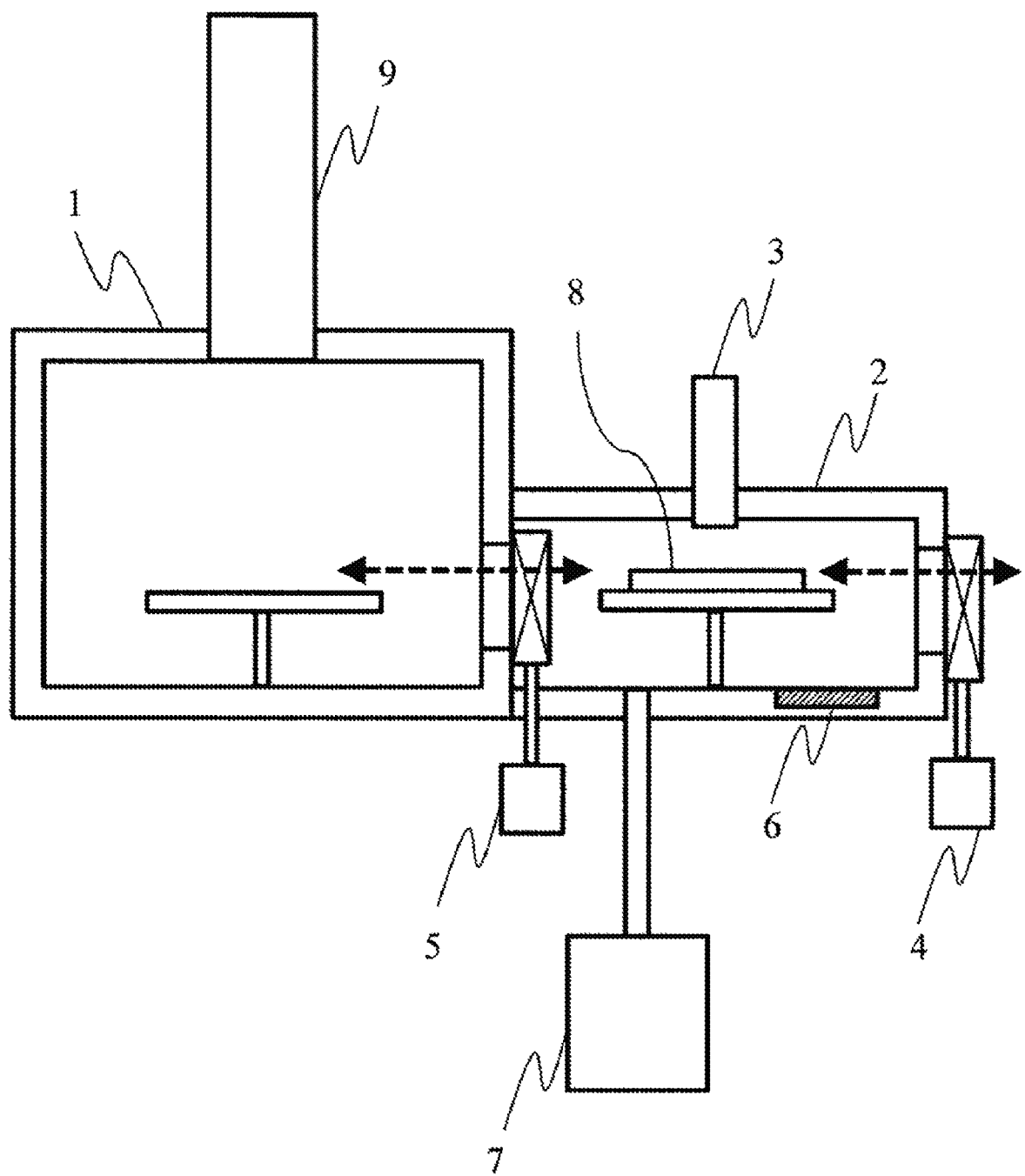
FIG. 1 is a diagram illustrating an example of a charged particle beam device including a foreign substance detection device.

When observing a sample using a scanning electron microscope or the like, it is necessary to keep the vacuum sample chamber in a clean vacuum in order to prevent discharge and sample contamination due to foreign substances. For this purpose, when the sample is loaded into the vacuum sample chamber, a preliminary exhaust chamber called a load lock chamber is once released into the atmosphere, and after the sample is put in, vacuum evacuation is performed to make a vacuum state, and then, the sample is transported to the vacuum sample chamber. Thus, the vacuum sample chamber can always maintain a clean vacuum. When discharging (unloading) the sample, after the sample is moved from the vacuum sample chamber to the load lock chamber, the load lock chamber is released to the atmosphere and the sample is unloaded. By the above processes, the vacuum sample chamber can theoretically always maintain a clean vacuum.

On the other hand, some samples loaded into the scanning electron microscope have foreign substances (fine particles) attached thereto. For example, tens of thousands of foreign substances may be scattered when the load lock chamber is released to the atmosphere for taking out the sample from the load lock chamber. The scattered foreign substances are gradually accumulated in the load lock chamber. The accumulated foreign substances are brought in when the sample is loaded into the vacuum sample chamber. As a result, there is a possibility that a discharge due to foreign substances occurs at a high voltage portion in the vacuum sample chamber. On the other hand, if the amount of scattered foreign substances can be properly evaluated, it is possible to specify the cause of the generation of foreign substances and the timing of maintenance. In addition, it is conceivable that the degree of generation of foreign substances for each sample, the degree of scattering of foreign substances, and the like are important information. For example, if the degree of generation of foreign substances can be determined by using a scanning electron microscope used as a sample inspection device or measurement device, a determination can be made to clean a sample on which many foreign substances are placed before the sample is brought into the next manufacturing process, etc. Furthermore, it is possible to appropriately determine the maintenance time of the inspection device and the measuring device.

In the example described below, a charged particle beam device capable of appropriately evaluating the amount of foreign substances will be mainly described. In the following embodiments, a scanning electron microscope will be described as an example of a charged particle beam device. However, the present invention is not limited thereto, and can be applied to other charged particle beam devices such as an ion beam irradiation device. Following embodiments will describe a charged particle beam device provided with a foreign substance detection device mainly composed of a dust collecting electrode in the load lock chamber and a parallel plate electrode for detecting the volume of the foreign substances as a capacitance.

According to the above configuration, the amount of foreign substances accumulated in the load lock chamber can be grasped, and the amount of foreign substances can be monitored each time a sample is loaded into the load lock chamber. When the amount of foreign substances accumulated in the load lock chamber is at a value that increases the risk of discharge, and when a sample with a large amount of foreign substances scattered is detected, it is possible to select measures to prevent discharge and prevent contamination of the device in the following process in advance.

A foreign substance detection device provided in the load lock chamber is configured to include an interelectrode capacitance detection circuit and a plurality of electrodes connected to the interelectrode capacitance detection circuit. Preferably, an electrode (first electrode group) connected to one end of the input (measurement terminal) of the interelectrode capacitance detection circuit and an electrode (second electrode group) connected to the other end of the input of the interelectrode capacitance detection circuit are alternately arranged apart from each other, and thus, a circuit in which a plurality of capacitors are connected in parallel are formed between one end and the other end of the input of the interelectrode capacitance detection circuit. In that case, for example, the flat plate-like first electrode and the second electrode that are long in a specific direction are alternately arranged so as to be parallel.

As described above, by forming a plurality of capacitors in the load lock chamber and providing a detection element for detecting the capacitance between the electrodes of the plurality of capacitors, the amount (volume) of foreign substances brought into the load lock chamber and attached between the electrodes can be taken as a change in capacitance. It is also possible to provide a circuit for calculating the change in capacitance as a change in the volume amount of foreign substances. Furthermore, the change in volume amount using a calculation formula or a table for obtaining the volume change amount from the change amount of the foreign substances may be calculated by one or more computer subsystems. These calculation formula and table are stored in advance in a predetermined storage medium so as to be read out as necessary.

In addition, by arranging the detection element as described above on a foreign substance collector via an insulating layer, it is possible to collect and detect a wide range of foreign substances even with a small detection element.

Example 1

FIG. 1 is a diagram illustrating an example of a scanning electron microscope including a load lock chamber. The scanning electron microscope illustrated in FIG. 1 includes a vacuum sample chamber 1 that maintains the periphery of a sample 8 (semiconductor wafer or the like) that is an electron beam irradiation target in a vacuum state, a load lock chamber (preliminary exhaust chamber) 2 for evacuating the surrounding space of the sample 8 before the sample 8 is introduced into the vacuum sample chamber 1, and an electron beam column 9.

The electron beam column 9 includes a beam source for emitting an electron beam, an optical element for focusing and deflecting the electron beam emitted from the beam source, a detector for detecting electrons obtained by irradiating the sample with the electron beam, and the like. These components of the scanning electron microscope are controlled by a control device (not illustrated). The control device includes one or more computer subsystems, and the computer subsystem is communicatively coupled to various sensors as described in this specification, and based on the information obtained by the various sensors, each component constituting the scanning electron microscope is controlled.

The control device is communicatively coupled to a display device (not illustrated), and further includes one or more computer subsystems for displaying information related to foreign substances in the vacuum chamber as will be described later. If necessary, the control device may cause information on the foreign substance (the amount of foreign substances, the timing when the amount of foreign substances exceeds a predetermined value, the transition of changes in the amount of foreign substance, the increased amount of foreign substances per unit time, and the type of the introduced sample when the increased amount of foreign substances exceeds a predetermined value, the manufacturing process of the introduced sample, and the like) to be output to the display device or the like.

The load lock chamber 2 is provided with a nitrogen introduction port 3 (nitrogen gas introduction mechanism) for bringing the inside of the load lock chamber 2 to atmospheric pressure. Since nitrogen is introduced from the nitrogen introduction port 3, the internal space of the load lock chamber 2 can be changed from a vacuum to the atmosphere.

Figure 4:
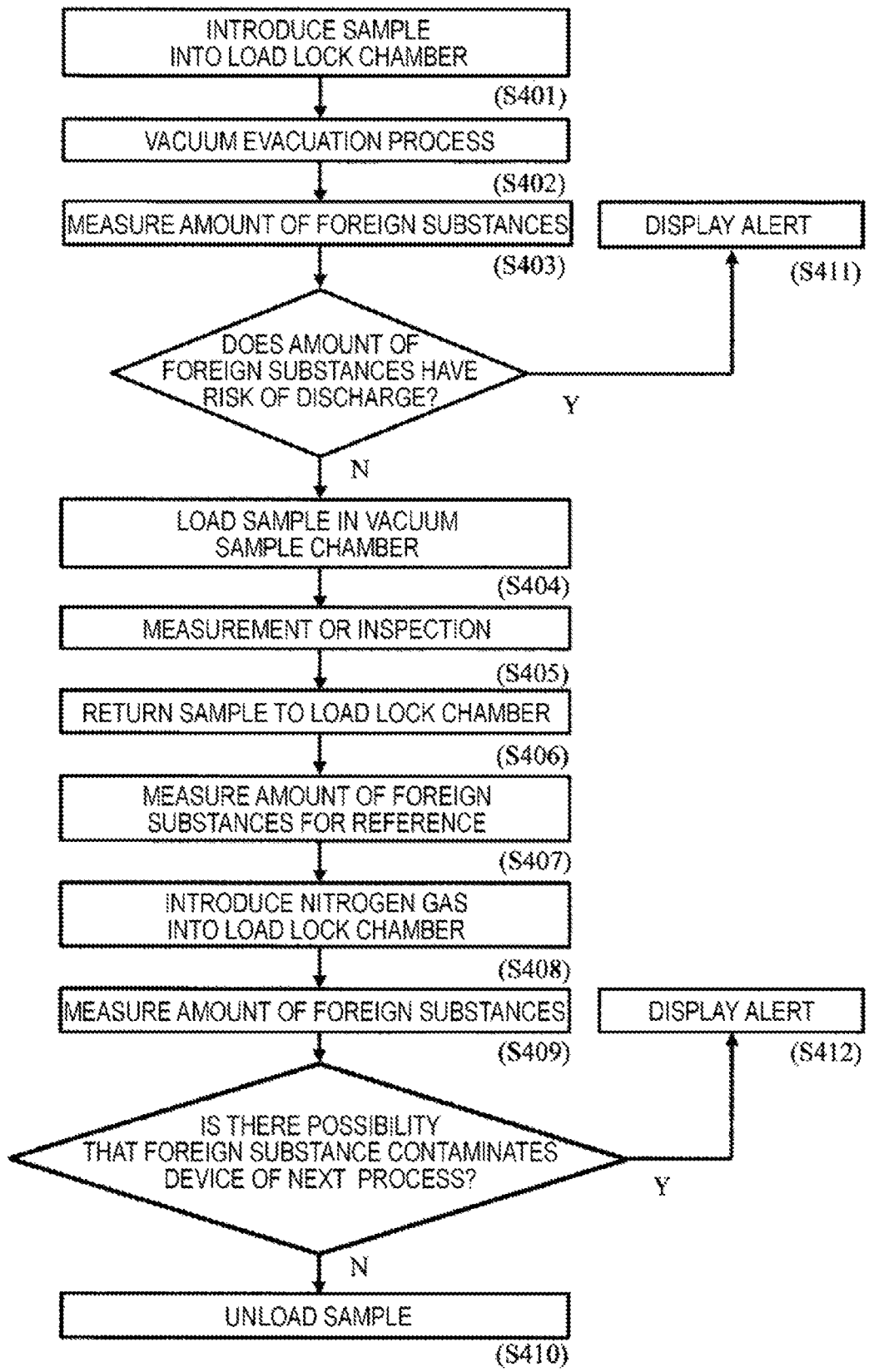
FIG. 4 is a flowchart illustrating processes from loading to unloading a sample into and from a charged particle beam device.

Hereinafter, the flow of processes from the loading of the sample to the unloading of the sample with regard to the scanning electron microscope will be described with reference to the flowchart of FIG. 4. First, in order to introduce the sample 8 into the vacuum sample chamber 1, first, a valve 4 is opened in order to introduce the sample 8 from the external space into the load lock chamber 2. The sample 8 is introduced from a sample introduction port of the load lock chamber 2 where the valve 4 is released by a robot mechanism (not illustrated), and then, the valve 4 is closed to block the load lock chamber 2 and the external space (atmosphere) (step 401).

Next, the inside of the load lock chamber 2 is made to a vacuum state by vacuum evacuation using a vacuum pump 7 provided in the load lock chamber 2 (step 402). After the degree of vacuum in the load lock chamber 2 reaches a specified value, a gate valve 5 is opened, the sample 8 is loaded into the vacuum sample chamber 1 (step 404), and based on scanning of an electron beam to a predetermined pattern or defect, measurement and inspection of the sample 8 are executed (step 405).

After completion of the measurement and inspection, the gate valve 5 is opened, and the sample 8 is unloaded from the vacuum sample chamber 1 to the load lock chamber 2 by the robot mechanism (step 406). In the load lock chamber 2 into which the sample 8 has been moved, nitrogen is introduced from the nitrogen gas introduction port 3 (step 408), and the inside of the load lock chamber 2 is at atmospheric pressure. After setting the inside of the load lock chamber 2 to atmospheric pressure, the valve 4 is opened and the sample 8 is unloaded (step 410).

In the above processing steps, it is preferable to measure the amount of foreign substances (step 403) after the sample 8 is loaded into the load lock chamber 2 in order not to cause discharge caused by the foreign substance. If the amount of foreign substances exceeds a predetermined value, or the increased amount per unit time exceeds a predetermined value, or the change in the amount of foreign substances is steeper than a predetermined value, etc. before introducing the sample 8 into the vacuum sample chamber 1, a determination can be made to perform measures such as prevention of foreign substances from being introduced into the vacuum sample chamber 1 in advance or introduction of the sample into the vacuum sample chamber again after cleaning the sample, by displaying an alert on the display device or the like (step 411). Further, along with the issuance of an alert, a control for automatically stopping the device may be performed.

Further, when nitrogen gas is introduced from the nitrogen gas introduction port 3 in a state where the sample 8 which completed the measurement and inspection by the scanning electron microscope is present in the load lock chamber 2, it is conceivable that foreign substances of micron order, which adhere to the sample 8, are scattered in the load lock chamber 2. This is because the foreign substance adhering to the sample 8 is scattered by the impact of introducing nitrogen. Therefore, the amount of foreign substances placed on the sample is appropriately evaluated by evaluating the amount of foreign substances at the time of discharging (unloading) of the sample with nitrogen introduction. By appropriately evaluating the amount of foreign substances placed on the sample, when the sample is a semiconductor wafer, it can be determined whether or not to bring the semiconductor wafer into the next manufacturing process.

Figure 2:
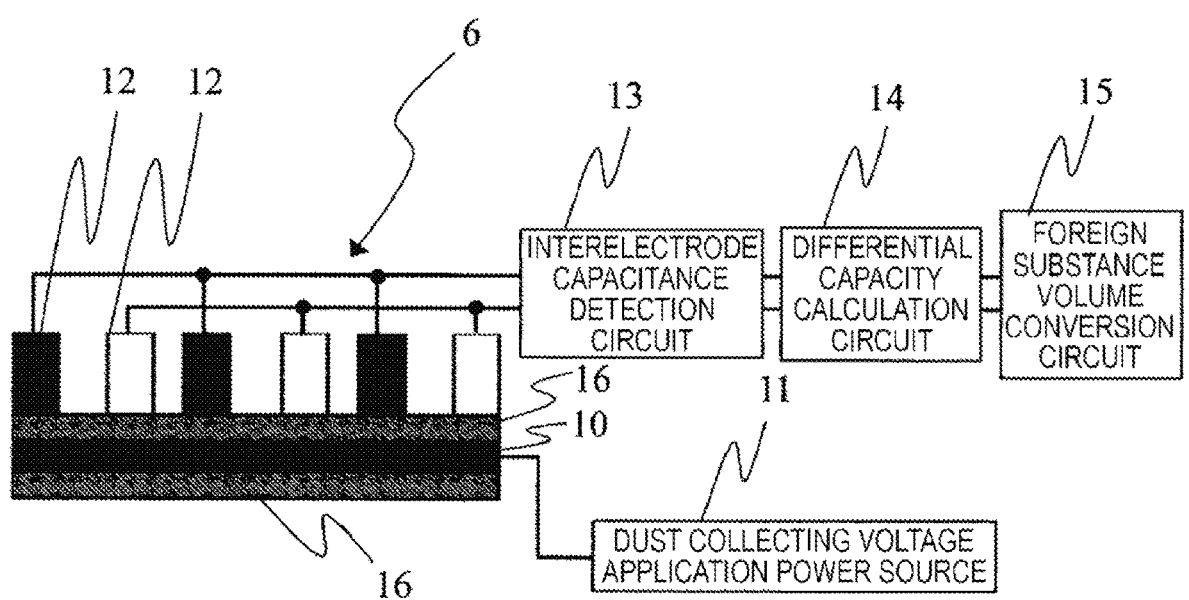
FIG. 2 is a diagram illustrating an outline of a foreign substance detection device.

FIG. 2 is a diagram illustrating an outline of a foreign substance detection device installed inside the load lock chamber 2.

The foreign substance detection device (a detector assembly configured to detect dust and fine particles) mainly includes a sensor unit 6 in which a plurality of capacitance measuring electrodes 12 are arranged, a dust collecting electrode 10 for collecting dust in the sensor unit 6, insulators 16 provided so as to sandwich the dust collecting electrode 10, a dust collecting voltage application power source 11 for applying a voltage to the dust collecting electrode 10, an interelectrode capacitance detection circuit 13 (capacitance measuring device) for measuring the capacitance between the electrodes, a differential capacity calculation circuit 14 for identifying a change in capacitance by comparing the capacitance detected by the interelectrode capacitance detection circuit 13 with the reference data, and a foreign substance volume conversion circuit 15 for converting the difference value of the capacitance calculated by the differential capacity calculation circuit 14 into the volume of the foreign substances corresponding to the difference.

One or more computer subsystems that output volume values, using a database or an arithmetic expression indicating the relationship between the capacitance and the volume from the output of the interelectrode capacitance detection circuit, may be included in the foreign substance detection system. Further, instead of converting to a volume value, an alert may be generated when a predetermined capacitance that is considered to have a large amount of foreign substances attached thereto is reached. Furthermore, instead of the volume value per se, other index values (parameters) that change according to the volume and the amount of foreign substances may be output using a conversion circuit or a database. Further, instead of the difference in the capacitance, the difference may be obtained after the conversion to a parameter such as the amount of foreign substance.

A method for calculating the amount of foreign substances scattered when the sample is unloaded using the detector assembly as described above will be described with reference to the flowchart illustrated in FIG. 4. After transporting the sample 8 from the vacuum sample chamber 1 to the load lock chamber 2, the capacitance between the capacitance measuring electrodes 12 is measured as reference data before introducing nitrogen into the load lock chamber 2 (step 407).

Next, nitrogen is introduced into the load lock chamber (step 408). The foreign substance scattered at this time is accumulated on the detection unit (sensor unit 6) of the foreign substance detection device. The capacitance at this time is measured (step 409). It is conceivable that the difference value between the amount of foreign substances obtained from the capacitance acquired in step 407 and the amount of foreign substances obtained from the capacitance obtained in step 409 is the amount of foreign substances scattered and dropped from the sample 8 due to the introduction of nitrogen gas. By acquiring reference data before introducing the sample into the load lock chamber 2 and comparing the reference data with the amount of foreign substances after introducing nitrogen gas, the amount of foreign substances placed on the sample can be accurately estimated. Since not all foreign substances placed on the sample is detected, the absolute amount of foreign substances placed on the sample is not known. However, since the amount of foreign substances detected is considered to change according to the amount placed on the sample, changes in the number of foreign substances can be evaluated.

In addition, by providing the detector assembly with the dust collecting electrode 10, the foreign substance scattered in the load lock chamber 2 can be adsorbed. Furthermore, since the scattered foreign substance can be collected and detected, the amount of foreign substances can be estimated more accurately. It is desirable that the detector assembly is installed on the floor surface (bottom surface) of the load lock chamber 2 where the foreign substance is likely to accumulate, or on the airflow puddle in consideration of airflow. FIG. 1 illustrates a configuration in which the sensor unit 6 is installed on the bottom surface inside the load lock chamber 2.

According to the configuration illustrated in FIG. 1, the foreign substance can be deposited on the plurality of opposing capacitance measuring electrodes 12 by the foreign substance dust collecting electrode 10 of the sensor unit 6 installed in the airflow puddle. In the state where the foreign substance has accumulated, the capacitance between the capacitance measuring electrodes 12 is measured, and the difference from the reference data is calculated by the differential capacitance calculation circuit 14. As described above, the capacitance (difference) calculated by the differential capacity calculation circuit 14 is a value reflecting the amount of foreign substances increased by the introduction of the sample 8 into the load lock chamber 2. This value can be calculated as the volume of the foreign substances by performing conversion with the foreign substance volume conversion circuit 15. In particular, by acquiring reference data and foreign substance amount evaluation data before and after the airflow is generated in the load lock chamber 2, foreign substance data reflecting the amount of foreign substances placed on the introduced sample can be acquired.

Example 2

In the above-described example, the foreign substance detection assembly having the sensor unit in which the plurality of electrodes are arranged on the insulating layer has been described. However, in this embodiment, a foreign substance detection assembly that can detect the capacitance change caused by the adhesion of the foreign substance without arranging a large number of electrodes will be described.

Figure 3:
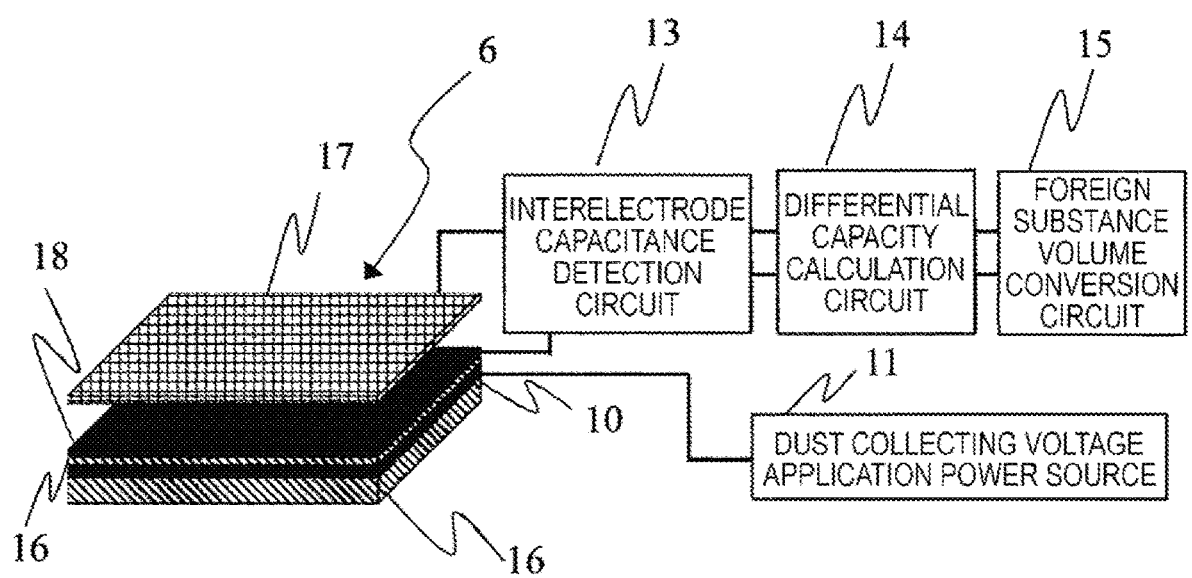
FIG. 3 is a diagram illustrating an outline of a foreign substance detection device.

FIG. 3 is a diagram illustrating a second example, and illustrates the sensor unit 6 having a structure in which a mesh-like electrode 17 is laminated on a plate-like electrode 18. The mesh-like electrode 17 and the plate-like electrode 18 are arranged to be spaced apart by interposing an insulating spacer (not illustrated). Further, one end of the input of the interelectrode capacitance detection circuit 13 is connected to the mesh-like electrode 17 and the other end of the input is connected to the plate-like electrode 18.

The scattered foreign substance is adsorbed by the adsorbing force generated by the dust collecting electrode 10 to which a voltage is applied from the dust collecting voltage application power source 11, passes through an opening of the mesh-like electrode 17, and falls onto the plate-like electrode 18. The capacitance between the mesh-like electrode 17 and the plate-like electrode 18 changes due to the influence of the fallen foreign substance. By detecting the change in the capacitance with respect to the reference value, the increased amount of foreign substances can be determined.

Specifically, the capacitance between the two electrodes is measured using the interelectrode capacitance detection circuit 13. The foreign substance volume conversion circuit 15 converts the change (difference) in the capacitance as the amount of foreign substance. The differential capacity calculation circuit 14 calculates, for example, the difference in the capacitance before and after the sample introduction or before and after the nitrogen gas introduction. In the foreign substance volume conversion circuit 15, the difference in the capacitance may be converted into other parameters related to the amount of foreign substance, such as the amount and volume of foreign substance, other index values indicating, the foreign substance amount and volume, an index value indicating the possibility of discharge in the vacuum sample chamber, an index value indicating the degree of the influence on the next manufacturing process, the remaining time until the timing which requires cleaning of the inside of the load lock chamber, a maintenance time, and the like.

Further, one or more computer subsystems for deriving the parameters may be used with reference to a table (database) indicating the relationship between the output signal of the interelectrode capacitance detection circuit 13 and the parameters as described above, or an arithmetic expression.

According to the detector assembly including the sensor unit 6 illustrated in FIG. 3, it is possible to capture the change in the capacitance due to the foreign substance having a possibility of scattering at a plurality of positions on the sensor unit 6 with a relatively simple configuration in which two electrodes are laminated and installed.

In the above example, the example in which the mesh-like electrode is employed as the upper electrode has been described. However, any configuration may be used as long as the foreign substance passes through the opening and falls between the upper electrode and the lower electrode. Another porous electrode different from the mesh electrode provided with a large number of holes may be used.

Example 3

Figure 5:
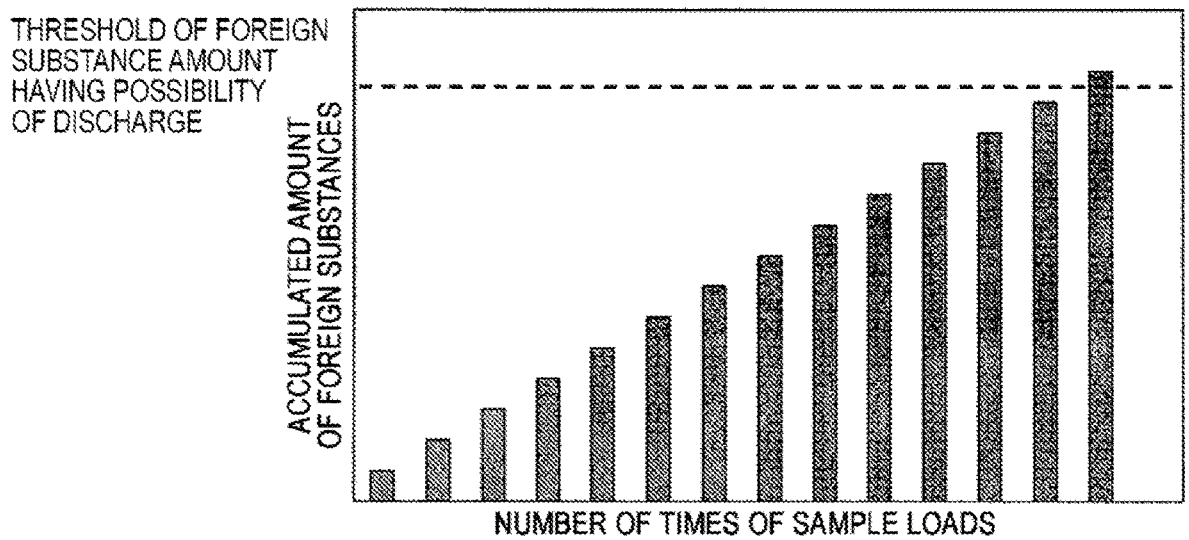
FIG. 5 is a diagram illustrating an example of displaying a transition of the detected amount of foreign substance.

FIG. 5 is a diagram illustrating an example of a foreign substance detection result output from one or more computer subsystems to the display device (not illustrated). FIG. 5 illustrates the relationship between the number of times of sample loads and the amount of foreign substance. As illustrated in FIG. 5, by visualizing the relationship between the number of times of introducing the sample to the load lock chamber 2 and the amount of foreign substance, it is possible to grasp the transition of the increase in foreign substances and the occurrence of discharge due to the presence of foreign substances can be predicted in advance. In addition, when a predetermined threshold value is exceeded, it is possible to urge to stop measurement or inspection by displaying an alert.

Figure 6:
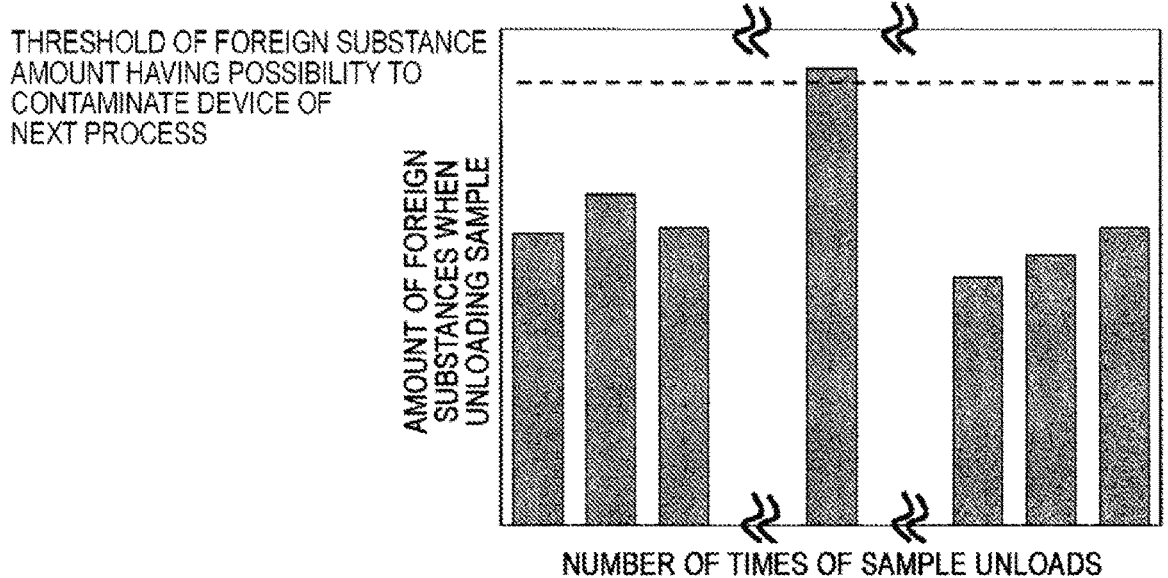
FIG. 6 is a diagram illustrating an example of displaying a transition of the amount of foreign substances generated when a sample is unloaded.

FIG. 6 shows the relationship between the number of times of sample unloads and the change in the amount of foreign substances before and after the introduction of nitrogen gas during sample unloading. By performing the display illustrated in FIG. 6, it is possible to urge the operator not to bring in the foreign substance to the device used in the next manufacturing process of measurement or inspection.

In the above-described example, the example in which the sensor unit of the foreign substance detection device is provided in the load lock chamber has been described. However, for example, when it is desired to specify the amount of foreign substances brought into the vacuum sample chamber, the foreign substance detection device may be installed in the vacuum sample chamber.

REFERENCE SIGNS LIST

1: Vacuum sample chamber
2: Load lock chamber
3: Nitrogen introduction port
4: Valve
5: Gate valve
6: Sensor unit
7: Vacuum pump
8: Sample
9: Electron beam column
10: Dust collecting electrode
11: Dust collecting voltage application power source
12: Capacitance measuring electrode
13: Interelectrode capacitance detection circuit
14: Differential capacitance calculation circuit
15: Foreign substance volume conversion circuit
16: Insulator
17: Mesh-like electrode
18: Plate-like electrode

The invention claimed is:
1. A charged particle beam device comprising:
a charged particle beam column configured to irradiate a sample with a charged particle beam;
a vacuum chamber configured to create a vacuum around the sample;

a plurality of electrodes arranged in the vacuum chamber; and a capacitance measuring device for measuring the capacitance between the plurality of electrodes; wherein the vacuum chamber includes a vacuum sample chamber for introducing a sample irradiated with the charged particle beam, a preliminary exhaust chamber for vacuum evacuating an atmosphere around the sample before introducing the sample into the vacuum sample chamber, and the plurality of electrodes are installed in the preliminary exhaust chamber.

2. The charged particle beam device according to claim 1, wherein the plurality of electrodes include a first electrode group connected to one side of a measurement terminal of the capacitance measuring device and a second electrode group connected to the other side of the measurement terminal of the capacitance measuring device, and the electrodes of the first electrode group and the electrodes of the second electrode group are alternately arranged.

3. The charged particle beam device according to claim 1, wherein the plurality of electrodes include a plate-like electrode and a porous electrode disposed on the plate-like electrode, and one side of a measurement terminal of the capacitance measuring device is connected to the plate-like electrode and the other side of the measurement terminal of the capacitance measuring device is connected to the porous electrode.

4. The charged particle beam device according to claim 1, further comprising:

a dust collecting electrode arranged under the plurality of electrodes via an insulator and configured to be applied a dust collecting voltage.

5. The charged particle beam device according to claim 1, further comprising:

a control device communicatively coupled to the capacitance measuring device, wherein the control device is configured to derive a parameter related to the amount of foreign substances based on the output of the capacitance measuring device.

6. The charged particle beam device according to claim 1, further comprising:

a display device communicatively coupled to the control device, wherein the control device is configured to display an alert on the display device when the parameter satisfies a predetermined condition.

7. The charged particle beam device according to claim 1, further comprising:

a gas introduction mechanism for introducing gas into the preliminary exhaust chamber, wherein the control device is configured to perform the capacitance measurement by the capacitance measuring device before and after the gas introduction by the gas introduction mechanism.

8. The charged particle beam device according to claim 7, wherein the control device is configured to perform a difference calculation of capacitance or parameters before and after the gas introduction.

9. The charged particle beam device according to claim 8, further comprising:

a display device communicatively coupled to the control device, wherein the control device is configured to cause the display device to display a relationship between the number of times of sample unloads and the difference calculation result.

10. The charged particle beam device according to claim 1, further comprising:

a display device communicatively coupled to the control device, wherein the control device is configured to cause the display device to display a relationship between the number of times of sample loads into the preliminary exhaust chamber and the parameter.

11. A charged particle beam device comprising:

a charged particle beam column configured to irradiate a sample with a charged particle beam;

a vacuum chamber configured to create a vacuum around the sample;

a plurality of electrodes arranged in the vacuum chamber;

a capacitance measuring device for measuring the capacitance between the plurality of electrodes; and a control device communicatively coupled to the capacitance measuring device to derive a parameter related to the amount of foreign substances based on the output of the capacitance measuring device.

* * * * *